United States Patent [19]

Hines et al.

[11] 4,427,250

[45] Jan. 24, 1984

[54] PRINTED CIRCUIT BOARD TEST FIXTURE WITH COMPLIANT PLATEN

[75] Inventors: Clyde K. Hines, Claremont; Lyle Fettig, La Verne, both of Calif.

[73] Assignee: Everett/Charles Test Equipment, Inc., Pomona, Calif.

[21] Appl. No.: 226,520

[22] Filed: Jan. 19, 1981

[51] Int. Cl.³ .......................................... H01R 13/62
[52] U.S. Cl. .............................. 339/75 M; 339/117 P
[58] Field of Search ............ 339/75 M, 117 R, 117 P; 324/158 F, 73 P C

[56] References Cited

U.S. PATENT DOCUMENTS

| | | | |
|---|---|---|---|
| 2,978,666 | 4/1961 | Mc Gregor | 339/117 P |
| 3,654,585 | 4/1972 | Wickersham | 339/17 M |
| 3,757,219 | 9/1973 | Aksu | 339/75 M |
| 3,942,778 | 3/1976 | Fadiga et al. | 324/73 PC |
| 4,099,120 | 7/1978 | Aksu | 324/158 P |
| 4,112,364 | 9/1978 | Katz | 324/158 F |
| 4,138,186 | 2/1979 | Long et al. | 339/18 R |

FOREIGN PATENT DOCUMENTS 1057410 1/1979 Canada .
1508884 4/1978 United Kingdom .

OTHER PUBLICATIONS

IBM Technical Disclosure Bulletin vol. 10, no. 8, 1/1968 "Thermal Test Socket" by R. Bove.
Brochure entitled Inflatable Seals Seal Master Corporation How the Seal Works

*Primary Examiner*—John McQuade
*Attorney, Agent, or Firm*—Christie, Parker & Hale

[57] ABSTRACT

Apparatus is disclosed for making electrical contact with test points on a generally thin planar test member. The test member is mounted for movement to a location for test. A plurality of conductive probe heads, each having a contact point are arranged so that the contact points lie generally in a plane that is co-planar with the location for test. At least one flexible inflator is mounted adjacent the test member. Upon distension, the inflator urges the test member against the probe heads such that the contact points of the probe heads contact selected test points on the test member.

62 Claims, 10 Drawing Figures

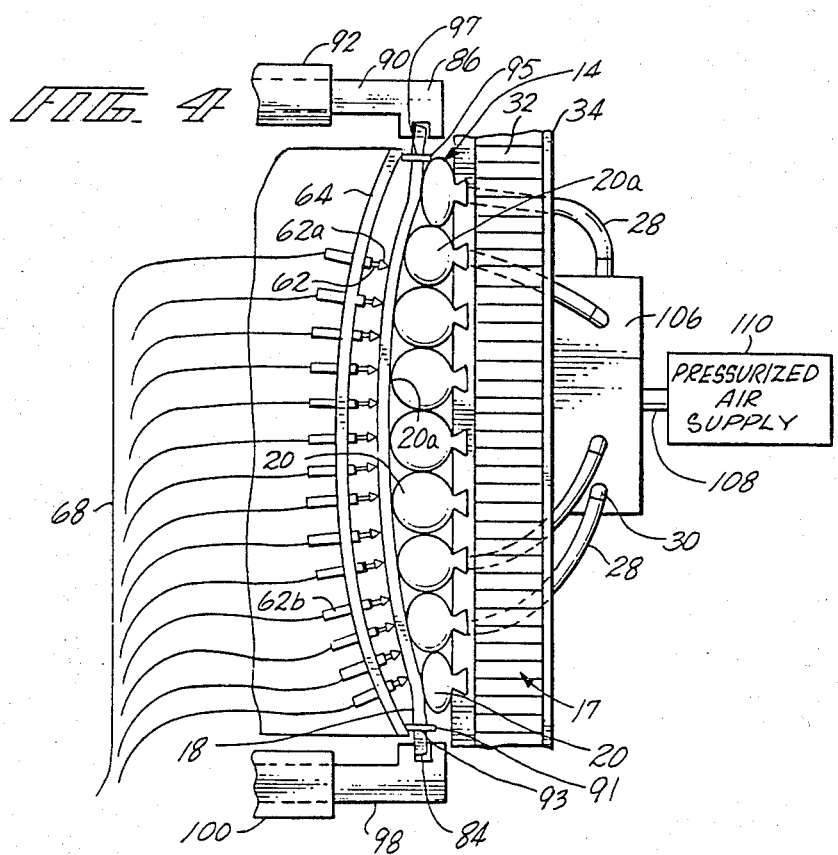
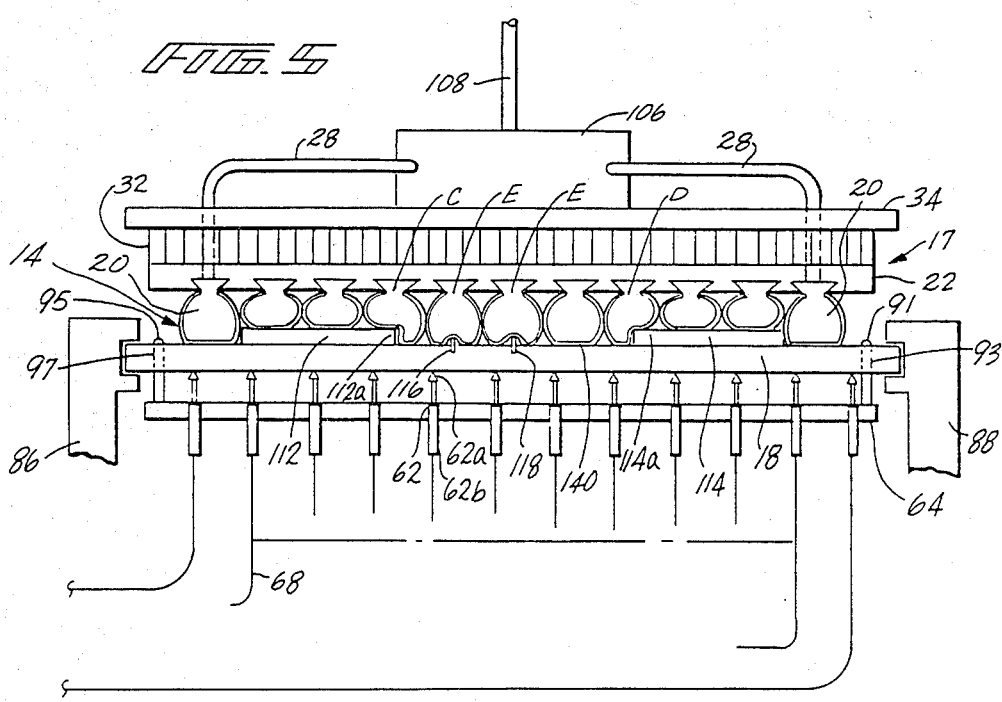

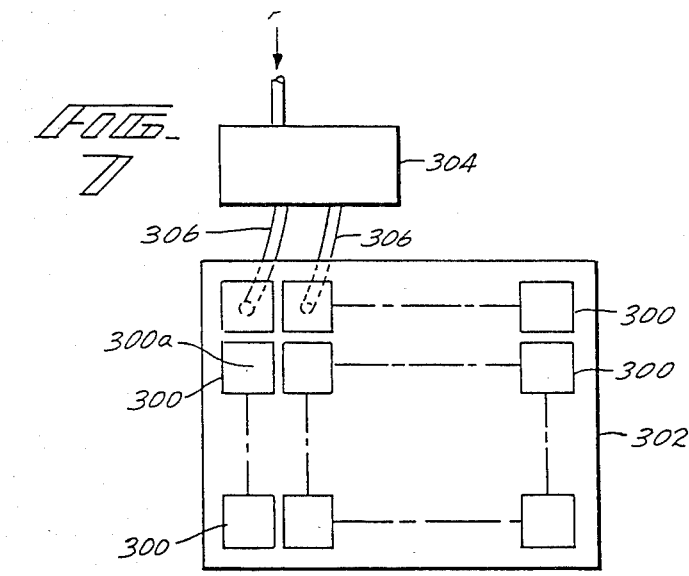
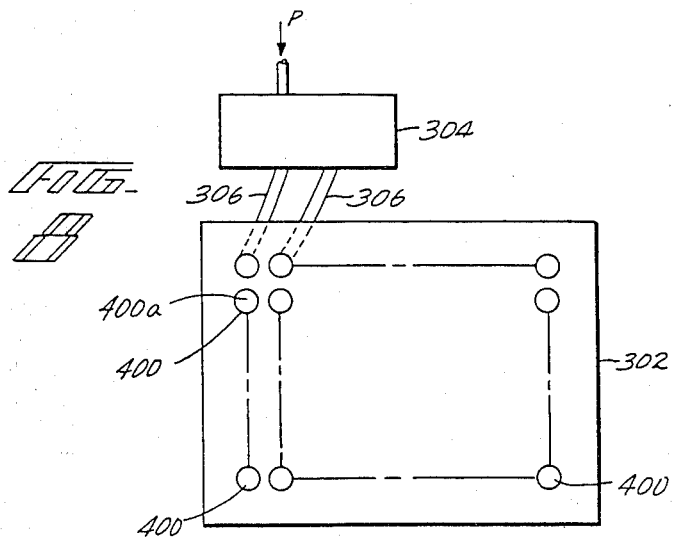
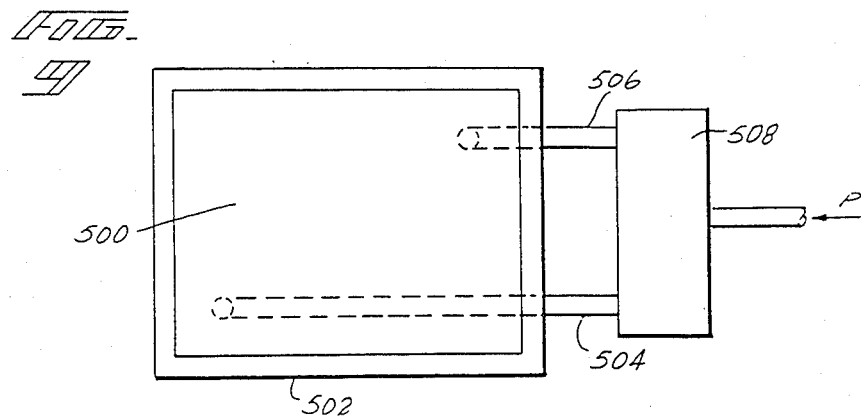

PRINTED CIRCUIT BOARD TEST FIXTURE WITH COMPLIANT PLATEN

BACKGROUND OF THE INVENTION

This invention relates to apparatus for bringing electrical test points on planar test members and a plurality of electrical contact probes into electrical engagement for test purposes.

Printed circuit boards containing printed wiring circuits on the planar surface thereof are generally used in the electronic art. "Bare boards" is a term used to identify printed circuit boards before components such as resistors, capacitors, etc., have been mounted on the board. "Loaded boards" is a term used to refer to printed circuit boards after the components have been mounted on the printed circuit board.

It is necessary to test both bare and loaded boards to detect any electrical errors in the manufacturing process. To this end, test fixtures of various types have been used to bring a circuit board under test into electrical engagement with a plurality of electrical test probes. The electrical test probes are generally spring probes mounted in a plate and have spring loaded probe heads, all facing in a common direction. The probe heads are very closely spaced in an array and it is common to refer to such an array of spring probes as a "bed of nails". The opposite end of each spring probe from the probe head is electrically connected by wiring to an analyzer or verifier which then analyzes the circuit board under test to determine whether, for example, there is proper electrical continuity or lack of continuity between test points, whether proper components are mounted on the printed circuit board, and whether the value of the components are correct.

Various types of test fixtures have been devised for bringing test probes forming a "bed of nails" into electrical contact with test points on circuit boards. One class of test fixtures employs a pneumatically or hydraulically actuated platen to force the circuit board such that test points thereon are forced against the spring probes. Mechanical actuation means that have been used include screw jacks and combinations of cams, rollers and levers. Such devices generally require a design such that the spring biased probe heads are not fully depressed in order to avoid damage by the forces created by the actuation mechanism. This type of device also requires a platen assembly that has sufficient structural strength to prevent bowing more than a few thousandths of an inch. Likewise the probe plate in which the "bed of nails" is mounted must also be structurally rigid to prevent bowing. In the event bowing occurs in either the platen or the probe plate, or in the event the circuit board under test is not completely planar, there is a possibility that some of the probe heads will not make electrical contact with the test points on the circuit board, or if contact is made, it is possible that the probe head to circuit board pressure will be so low that a good low resistance electrical contact will not be made.

Examples of devices of the foregoing type are typified by U.S. Pat. Nos. 3,654,585, and the article entitled "Fixture Produces Uniform Contact Pressure On Boards Under Test" by Everett/Charles, Inc. that appeared in the September, 1976 issue of *Electronic Packaging and Production*. In the Electronic Packaging device, a pneumatically expandable resilient device similar in shape to an innertube moves a platen which in turn moves a circuit board mounted thereon into electrical engagement with probe heads.

Another class of test fixture utilizes vacuum to draw a circuit board under test and an array of probes mounted in a probe plate into electrical contact. An advantage of this type of device is its ease and speed of operation as compared with the pneumatic or hydraulically actuated press-type device. A disadvantage of this device, however, is that the forces available to draw the circuit board under test and the probes into contact are limited by the differential pressure between the vacuum and atmospheric pressure.

In order to eliminate the problems of platen and probe plate bowing, one type of vacuum fixture has been proposed and is disclosed in U.S. Pat. No. 4,108,528. In this device a door plate and a resilient diaphragm member form opposing walls of a vacuum cavity. The diaphragm member has a rigid backup plate on the opposite side of the diaphragm member from the vacuum chamber. Rigid probes having a probe head on one end extend through the diaphragm member and backup plate and the probe heads are exposed in the vacuum chamber. The circuit board under test is positioned between the door plate and probe heads and vacuum is applied in the chamber, drawing the door plate and the combination of the diaphragm member, backup plate and probe heads together on opposite sides of the circuit board under test, pressing the probe heads into the diaphragm member. This technique has the advantage that equal and opposite forces are generally aplied uniformly over both the door plate and the backup plate. However, the circuit board under test may not necessarily be of uniform thickness, or all areas of the backup plate and door plate may not be of exact uniform flatness, or there may be other mechanical tolerance variations or there may be a combination of the aforementioned. Under these conditions, not all of the spring contact probes may be forced with sufficient pressure against the circuit board under test and cases may exist where some probe heads do not make contact at all. In this regard, it is generally desired that the probe heads be forced to a stop against the backup plate. Obviously, variation in flatness of the backup plate, the door plate, or the circuit board under test may cause one of the probe heads to have insufficient pressure exerted between the circuit board and the probe head.

The force needed to reliably provide the required electrical contact between each probe head and the circuit board under test is in the order of 4 ounces. Since the maximum obtainable force using vacuum is less than 15 pounds per square inch, and more likely 8 pounds per square inch, the average number of points per square inch which may be contacted on a printed circuit board is limited by the obtainable pressure. As a result, the practical reliable number of probe heads is limited to 30 to 40 points per square inch. Situations exist where much higher densities are desired.

Other arrangements have been devised for bringing an array of probes and a circuit board for test into electrical contact. By way of example, U.S. Pat. No. 3,942,778 proposes the use of a side-by-side parallel array of cylinders, wherein one of the ends of each cylinder bears against the circuit board under test, and the opposite ends of which are in a pressure chamber. Pressure applied in the pressure chamber forces each of the cylinders against the circuit board under test. With this arrangement, it is pointed out that the cylinders will compensate for irregularities in the surface of the circuit board, such as caused by components on the board. However, this device, because of its mechanical complexity, is expensive, difficult to manufacture and service, and the force required to actuate is likely to be greater than is required in an embodiment of the present invention.

Another type of device is disclosed in U.S. Pat. No. 3,016,489. In this device, a pressure chamber has a flexible diaphragm element along one wall which forces probe assemblies against component leads on a circuit board under test. The probe assemblies are mounted and guided in a matrix aperture plate. Disadvantages of this device include its complexity and friction between the sliding surfaces of the probe assemblies and the matrix aperture plate.

SUMMARY OF THE INVENTION

Briefly, an embodiment of the present invention is test fixture or apparatus for making electrical contact with test points on a test member. The apparatus comprises a plurality of electrically conductive probe heads mounted in an array and facing in a substantially common direction for contact with test points on a test member. A compliant platen is mounted in opposed relation to the probe heads and comprises at least one flexible inflator facing the probe heads. Means is provided for mounting the test member between the probe heads and the at least one inflator. Fluid pressure applied in the at least one inflator causes the inflator to distend in engagement with the test member, forcing the test member against the probe heads. The inflator is adapted for substantially complying with the contour of the test member to maintain a substantially uniform pressure between the test member and each of the probe heads. With this arrangement, it will be evident to those skilled in the art that a test fixture is provided which overcomes or diminishes many of the disadvantages and problems encountered in the prior art devices. By way of example, such a test fixture is inexpensive to fabricate, more reliable, and more durable than most prior art devices. Additionally, such a fixture may in general engage and release the test member under test more quickly than fixtures using prior art techniques and as a result reduce the total cycle time. Further, such an arrangement applies a substantially uniform pressure between the test member and each of the probe heads, and contours to the shape of the test member thereby ensuring a reliable electrical contact.

Preferably, the platen comprises a plurality of flexible inflators. With this arrangement, either the same or a different pressure may be applied to each of the inflators and each flexible inflator will independently act to apply a uniform and compliant pressure against the corresponding surface of the test member.

Preferably, the plurality of inflators are mounted in a substantially common plane and in opposed relation to the probe heads.

Also preferably, each of the inflators comprises an elongated elastomeric tube.

Where it is desired to provide the same pressure over the entire area between the circuit board under test and the probe heads, means can be provided for equalizing the pressure between all of the inflators.

With the arrangement according to this invention, it is possible to allow some movement between the probe heads and the compliant platen. However, preferably a plate is provided for mounting the probe heads in substantially fixed relation to the compliant platen. Also preferably, at least one substantially rigid member is positioned on the opposite side of the inflator from the probe heads against which the inflator acts under pressure.

Preferably, the probe heads are mounted in an interchangeable test head which is removably mounted in the apparatus.

Preferably, there is a plurality of spring probes, and each of the probe heads comprises a spring biased probe head on a different one of the spring probes.

Preferably, the inflator has a front surface for engaging the test member which distends under pressure. The inflator is elastomeric and is thereby adapted for retracting the front surface from the distended position to a retracted position when pressure is removed.

One embodiment of the invention includes a plurality of inflators each of which has a substantially flat front portion for contacting the test member such that when the inflators are distended, the flat portions collectively define a substantially flat surface contacting a planar surface on the test member.

Another embodiment of the invention has a soft coating on the front side of the inflator for conforming to the contour of any irregularities on the test member.

BRIEF DESCRIPTION OF THE DRAWINGS

FIG. 4 is a schematic partial cross-sectional and side view of the compliant platen of FIG. 1, the test member and the front plate of the test head in the test condition, the spacing and contour of the parts have been exaggerated for purposes of illustration;

FIG. 5 is a schematic partial elevation cross-sectional and side elevational view of the compliant plate of FIG. 1 in contact with a loaded circuit board under test, the spacing and contour of the parts being exaggerated for purposes of illustration;

FIG. 7 is a schematic front elevation view of a compliant platen containing an array of generally square shaped inflators for an alternate embodiment of the invention;

FIG. 8 is a schematic front elevation view of a compliant platen containing an array of generally circular inflators for still another embodiment of the invention; and FIG. 9 is a schematic front elevation view of a compliant platen with a single inflator for even still another embodiment of the invention.

DETAILED DESCRIPTION

Figure 1:
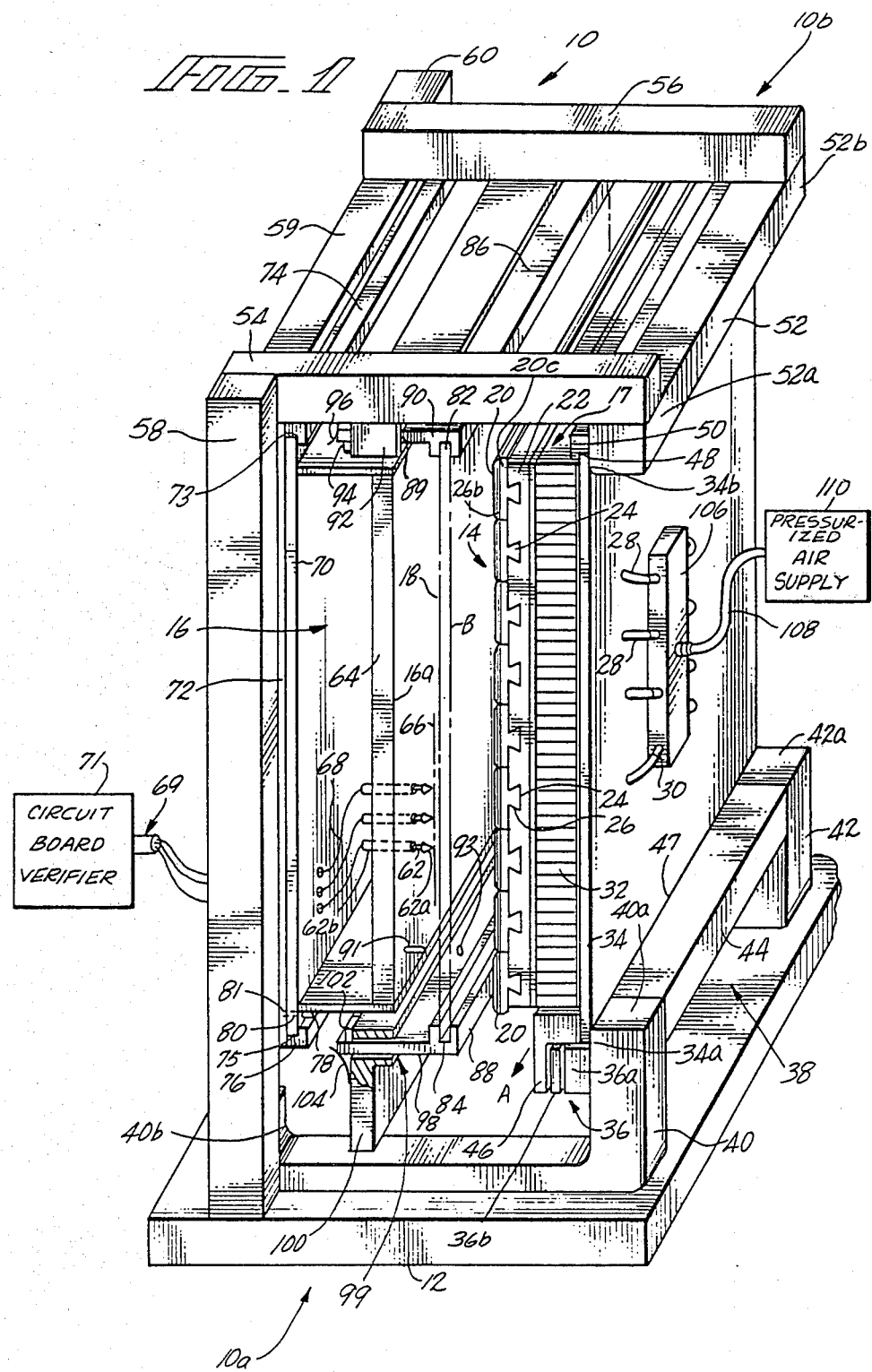
FIG. 1 is a pictorial and schematic drawing of a circuit board test fixture with compliant platen partially in section and embodying the present invention.

FIG. 1 depicts a printed circuit board test fixture 10 with compliant plate (hereinafter test fixture 10) embodying the present invention. The test fixture 10 includes a rigid frame 38 in which a compliant platen 14, a test head 16 and a unit under test (or test member), i.e., printed circuit board 18, are mounted. The compliant platen 14 is oriented vertically in the test fixture 10 and is formed of a plurality of flexible inflators 20 mounted to a rigid platen assembly 17. The platen assembly 17 is generally rectangular and includes a rigid plate 22, a support base 32 and a rigid mounting plate 34. The support base 32 is secured between the rigid plate 22 and mounting plate 34 to form a unitary assembly. Preferably, the support base 32 is a light-weight stiff material such as commercially-available honeycomb structure. One such commercially-available honeycomb structure is provided by Hexel Corporation under the designation HRH 327.

The inflators 20 are mounted to the rigid plate 22 in a dovetail arrangement. More specifically, the rigid plate 22 has a plurality of elongated and parallel grooves 26 that have a mortise shaped cross section. The inflators 20 have an elongated tenor shaped projection 24 that extends from and along the rear side of the inflator. The inflator 20 is mounted to the rigid plate 22 by means of engagement of the projection 24 with a corresponding mortise 26.

Figure 2:
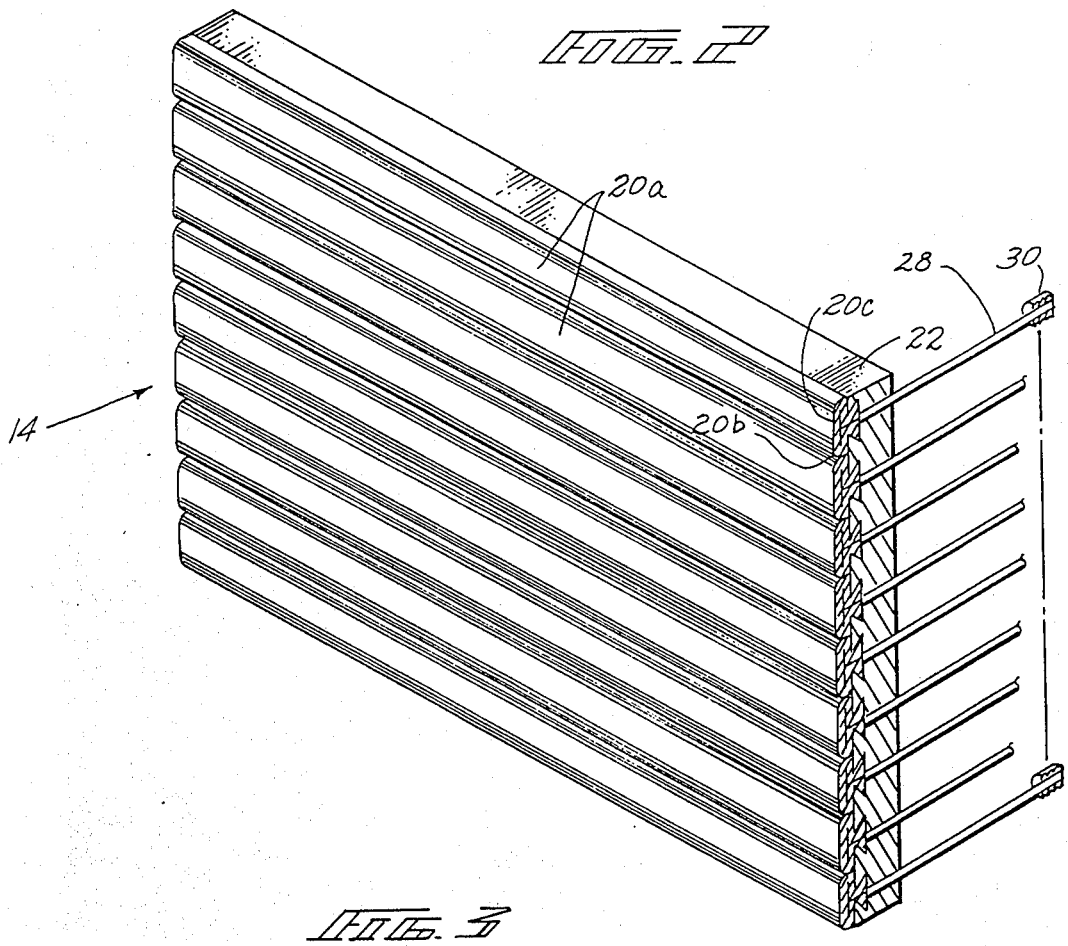
FIG. 2 is a perspective view of the compliant platen of FIG. 1 in the de-actuated state showing the right-hand edge in section.

As better shown in FIG. 2, the inflators 20 are arranged in parallel running transverse across the rigid plate 22. The inflators 20 preferably are closed-ended elastomeric molded tubes having a compact cross section envelope that is capable of distending under the action of pressurized gas or liquid introduced into the inflator. Preferably, the inflator is formed of standard vulcanized fiber reinforced elastomers. One such commercially-available product is provided by Seal Master Corporation and identified as "Inflatable Seals", Code S-1.

In FIG. 2, the inflators 20 are shown in a relaxed condition. Preferably, in the inflated condition, the front surface of the inflator depicted at 20a distends in a direction away from the rigid plate 22 and towards the test head 16 about 0.5 inch. Each inflator includes a connection stem 28 that provides a conduit for pressurized fluid into the inflator. A connector 30 coupled to the end of the stem and adapted for coupling to a source of pressurized fluid, typically pressurized air. Although only one connection is shown, it is to be understood that each stem has a connector. The connection stem 28 is preferably a flexible hose secured to an integrally molded fitting coupled to the inflator with a ferrule.

The platen assembly 17 and thus the compliant platen 14 are extendable and retractable relative to the test fixture 10 by virtue of ball slides 36. More specifically, ball slide segment 36a is rigidly secured to a frame assembly 38. The frame assembly 38 comprises a pair of generally C-shaped frames 40 and 42 mounted on the rigid base 12 and a cross beam 44 that is mounted, preferably by welding, to the ends 40a and 42a of the frames 40 and 42, respectively. Ball slide segment 36b is slideably engaged with segment 36a and is capable of translation relative to segment 36a. An angle bracket 46 is secured to segment 36b and to the mounting plate 34 and as a result, the platen assembly 17 is capable of sliding in and out of the test fixture 10 in a direction indicated by arrow A of FIG. 1. Although such feature is not essential to the invention, the movement capability of the platen assembly 17 provides for exposure of the surface 16a of the test head 16 and the compliant platen 14 for inspection and maintenance.

The interior facing surfaces of the frame portions 40a and 42a and the cross beam 44 lie in a vertical plane indicated at 47 and form a bracing surface against which the lower portion 34a of the mounting plate 34 is braced. The upper portion 34b of the mounting plate 34 travels in a channel 48 that is formed by angle bracket 50 and the interior facing surface of cross beam 52 to which the angle bracket 50 is secured. The interior facing surface of cross beam 52 forms a bracing surface against which the upper portion 34b is braced. Cross beam 52 is fixed in position by virtue of being mounted at ends 52a and 52b thereof and preferably by welding to front and rear horizontal upper beams 54 and 56 respectively which are, in turn, mounted, preferably by welding to front and rear vertical beams 58 and 60 respectively. The upper ends of vertical beams 58 and 60 are connected, preferably by welding to upper cross beam 59. The lower end of vertical beam 5 and the lower end (not shown) of vertical beam 60 are connected, preferably by welding, to the left hand ends (as seen in FIG. 1) of frames 40 and 42 respectively. The left hand end of frame 40 is shown at 40b whereas the left hand end of frame 42 is not shown in FIG. 1. As a consequence, a rigid support is provided for mounting the test head 16. It is to be noted that the foregoing described preferred manner of mounting provides for a substantially rigid test fixture so as to maintain both the test head 16 and platen assembly 17, mounted therein, substantially stationary during the making of electrical contact between the test member and probe heads.

Although not shown in detail, the test head 16 may be an interchangeable test head of a design generally similar to that described in U.S. Pat. No. 4,138,186. As shown schematically in FIG. 1, the test head 16 comprises an array of spaced apart electrically conductive probes 62 mounted in and extending through a probe plate 64 of the test head. The probes 62 are conventional spring probes and are of the type generally known in the test head art. An example of such spring probe is disclosed in U.S. Pat. No. 4,050,762. The probes 62 are arranged in an array which corresponds to the desired points of contacts on the printed circuit board 18 (hereinafter PCB 18) under test. Although only three probes are depicted in FIG. 1 for simplicity, it will be understood that there are many more probes provided one for each test point. Each probe 62 has a probe head 62a for contacting the PCB 18. The probe head 62a is electrically connected to the opposite end 62b of the probe 62. The probe heads 62a are resiliently biased away from the probe plate 64 by an internal coil spring (not shown) to a substantially common plane as indicated by broken line 66. Preferably, the probe heads 62a are exposed so as to directly contact a side of a the PCB 18 as it is positioned in a test location shown at 66 (see FIG. 1). The test location 66 is coplanar with the plane formed by the probe heads 62a. In such test location, the probe heads 62a make electrical contact with the selected points on the PCB 18.

Each probe end 62b is electrically connected by way of an electrical wire 68 through a multi-wire cable 69 to a circuit board verifier shown schematically in FIG. 1 at 71. An alternate method of interconnecting the electrical wires 68 to a circuit board verifier is disclosed in applicant's co-pending application entitled Low Insertion Force Electrical Interface Assembly and Actuable Interface Assembly Therefore, Ser. No. 148,537 filed May 9, 1980, now U.S. Pat. No. 4,377,318.

A rigid planar side plate 72 is secured to the front and rear vertical beams 58 and 60 and spans the area therebetween. The test head 16 has a base plate 70 that is received in upper and lower channels 73 and 75 respectively formed between upper and lower angle brackets 74 and 76 respectively and side plate 72 to which the angle brackets are secured. The test head 16 is located in a test position (as shown in FIG. 1) by means of engagement of alignment pin 78 with alignment bores 80 and 81 in base plate 70 and side plate 72, respectively. A similarly functioning second alignment pin and alignment bore (not shown) are also provided in the diagonally opposite corner of the test head 16. Engagement of alignment pin 78 with the corresponding alignment bores 80 and 81 is provided by insertion of the pin into the alignment bores subsequent to proper placement (as shown in FIG. 1) of test head 16 into the test fixture 10.

PCB 18 seats along the upper and lower edges thereof in upper and lower tracks 82 and 84 respectively. The tracks 82 and 84 are located in upper and lower slide brackets 86 and 88 respectively. The upper slide bracket 86 has a downward opening channel having a rectangular cross section that forms upper track 82. The upper slide bracket 86 has an essentially rectangular extension 90 slideable in a corresponding receiving channel 89 formed in an upper mounting frame 92. The channel 89 is marginally larger in cross section than extension 90 for permitting only movement of the extension 90 through the channel. The mounting frame 92 is secured to the front and rear horizontal beams 54 and 56 respectively. The extension 90 includes a stop 94 that prevents removal of the slide bracket from the mounting frame 92. A spring 96, preferably in the form of a leaf spring, is mounted in the mounting frame 92 and bears against the slide bracket 86 to urge the bracket out of the mounting frame to a position at which the stop 94 abuts against the mounting frame.

Similarly, the lower slide bracket 88 has an upward opening channel having a rectangular cross section that forms lower track 84. The lower slide bracket 88 has an essentially rectangular extension 98 slideable in a crorresponding receiving channel 99 formed in a mounting frame 100. The channel 99 is marginally larger in cross section than extension 98 for permitting only movement of the extension 98 through the channel. The mounting frame 100 extends between the front 10a and rear 10b of the fixture and is rigidly mounted on frames 40 and 42. The extension 98 includes a stop 102 that prevents removal of the slide bracket from the mounting frame 100. A spring 104, preferably in the form of a leaf spring, is mounted to the mounting frame 100 and bears against the slide bracket 88 for urging the slide bracket out of mounting frame to a position at which the stop 102 abuts against the mounting frame.

The channels, in mounting frames 92 and 100, provide a guide for guiding the slide brackets 86 and 88 respectively and a PCB 18 mounted therebetween to the test location. The spacing between the upper and lower tracks 82 and 84 respectively is sized to receive a PCB 18 and maintain it vertically stationary. PCB 18 is located along tracks 82 and 84 such that an alignment pin 91 on probe plate 64 is in registration with a corresponding alignment bore 93 in the PCB. A similarly functioning second alignment pin and alignment bore (not shown) are provided in the diagonally opposite corner of the test head and PCB. Engagement of the alignment pin 91 with the corresponding alignment bore 93, occurring during movement to the test location, provides for registration of the probe heads 62a with selected corresponding points to be probed on PCB 18.

By virtue of the orientation of the slide brackets 86 and 88, PCB 18, mounted therebetween, lies in a plane parallel to the plane formed by the probe heads 62a. In the nontest condition, a planar PCB 18 has a surface that faces the probes 62 and that is spaced about ¼ inch away from the probe heads 62a.

In the de-energized condition, the inflator surface area 20a that faces the PCB 18 lies in a plane essentially parallel to the PCB 18 and is spaced apart therefrom about ¼ inch. As will be described below, upon inflation of the inflators 20, the surface area 20a distends towards the PCB 18 and upon contact therewith urges the PCB 18 against the probes 62 so as to make contact of the probes with respective points to be probed on the PCB 18.

The flexible inflators 20 distend in reaction to the introduction of pressurized fluid preferably air therein. To this end, each inflator connection stem 28 is connected to a manifold 106 that is in turn connected by means of conduit 108 to a pressure regulated air supply 110. The platen assembly 17 has a coaxial bore opening into each mortise 26 for accommodating a respective inflator connection stem 28.

Figure 3:
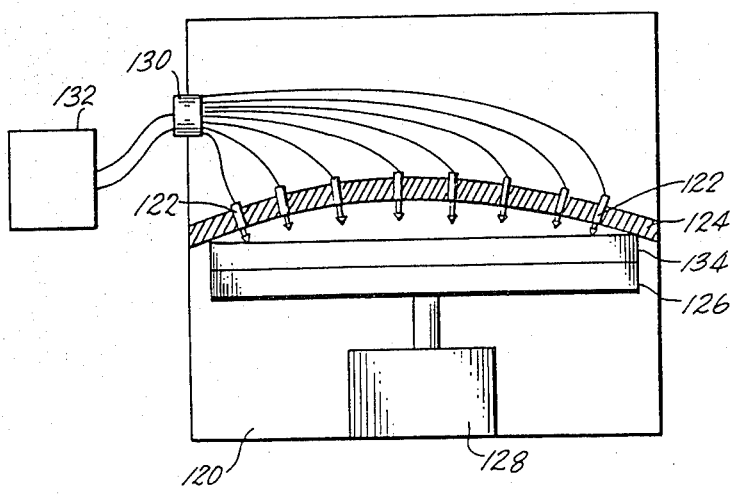
FIG. 3 is a schematic and side elevation view of a prior art device showing the probe plate in section, bowing of the probe plate during the test being exaggerated for illustration.

Consider now briefly, the operation of a printed circuit board tester of the prior art that is depicted schematically in FIG. 3. The tester has an outer housing 120 within which is contained an array of probes 122 mounted in a probe plate 124, a rigid non-compliant platen 126 driven either mechanically or pneumatically by drive source 128, and a connector 130 for electrically interconnecting the probes to a circuit verifier 132. A printed circuit board 134 (hereinafter PCB 134) is mounted on the platen 126 and upon initiation of a PCB test is driven upwards into electrical contact with the probes 122. Normally, the probe plate 124 is planar, however, and as depicted in FIG. 3, the probe plate 124 may have a bowed contour.

Such bowed contour may be an inherent defect or occurring, for example, in reaction to the force applied by drive source 128 as the PCB 134 comes in contact with the probes. In such case, not all the probe heads 62a will make electrical contact with corresponding points to be probed on the PCB 134. Thus, in the example shown in FIG. 3, only the outermost two probes 122 make electrical contact with the PCB 134. Under such conditions, the circuit board verifier 132 would give false information regarding such tests as, for example, open, shorts and continuity tests.

Platens acting in a planar manner are formed typically of rigid flat plates and thus would be incapable of conforming the contour of the PCB to that of the probe plate 124 and thus probes 122 so as to cause the entire surface of the PCB to make contact with all the corresponding probes.

Typically, the probes 122 are capable of travel inward about 0.050 inch prior to "bottoming out" against the probe plate 124. Thus, in the event that the bowed surface deviates more than about 0.050 inch from a normally planar surface, electrical contact points will be lost.

With reference to FIGS. 1 and 4, consider now briefly the operation of the printed circuit board test fixture with compliant platen of the present invention. It is to be noted that the distances between the compliant platen 14, the PCB 18 and the probe plate 64 as shown in FIG. 1 have been exaggerated for purposes of illustration and clarity. Additionally, the probe plate 64, as shown in FIG. 4, has an exaggerated bow-type contour for illustrating a significant advantage and advance over the prior art provided by the invention described herein.

Initially, the flexible inflators 20 are unpressurized and thus in a relaxed state. Accordingly, the compliant platen 14 is in the de-actuated condition. It is to be understood that the test head 16 and PCB 18 are properly mounted and thus under the action of springs 96 and 104, and the upper and lower slide brackets 86 and 88 are urged away from the probes 62 to the extent provided by the stops 94 and 102. The PCB 18 therefore is initially positioned at B (see FIG. 1) away from the probe heads 62a.

Upon introduction of pressurized air from pressurized air supply 110 to the inflators 20, each inflator surface area 20a distends outward toward PCB 18. Upon contact with and under the action of the force exerted by the surface 20a on the PCB 18, the slide brackets 86 and 88 and thus PCB 18 are urged toward the test head 16. As the PCB 18 travels towards the probe heads 62a of the test head, test head alignment pins 91 and 95 (see FIG. 5) engage corresponding PCB 18 alignment bores 93 and 97 respectively so that points to be probed on the PCB 18 are in registration with corresponding probe heads 62a.

Advantageously, each of the flexible inflators 20 distend and urge with equal force the portion of the PCB 18 in contact with such inflator against the probe heads 62a.

As shown schematically illustrated in FIG. 4, the upper and lower portions of the PCB 18 and the test head 16 are relatively closer together than the central portions thereof. Consequently, a greater amount of distension of the flexible inflators 20 at the central portion of the PCB 18 is required in order to urge the PCB 18 into contact with the respective probe heads 62a. In addition to overcoming any of the internal forces existing in a warped or contoured circuit board, the flexible inflators 20 act against the resistive forces provided by the probes 62. Thus, the inflators will tend to distend until they can no longer overcome the reactive forces provided by the corresponding probes. As an example, a regulated air pressure of 15 psi is required when the probes have a resistive force of 4 ounces and the probes are arranged in an array of about 60 probes per square inch. As another example, a regulated air pressure of 25 psi is required for spring probes having a 4 ounce resistive force when such probes are arranged in an array having about 100 probes per square inch. Thus, by utilizing a plurality of flexible inflators 20, curvatures and anomalies in either the PCB 18 or the test head 16 are compensated by virtue of the application of localized force provided by each of the respective inflators.

Upon removal of the pressurized air, the flexible inflators 20 will relax and the compliant platen 14 will retract away from the PCB 18. Under the action of springs 96 and 104 the upper and lower slide brackets 86 and 88 respectively will be urged away from the test head 16 and consequently the PCB 18 will be urged away from the probe heads 62a to the position shown in FIG. 1.

It should be noted that probing of a PCB may be terminated abruptly by the application of a vacuum by the pressurized air supply 110. Under the action of such vacuum, the flexible inflators 20 relax very rapidly with a consequent disengagement of the PCB and the probes 62. For those situations where unequal localized forces are to be applied to the PCB, a different pressure may be applied to different inflators. Accordingly, a plurality of manifolds coupled to different regulated pressures may be provided for supplying air at different pressure to selected inflators. By way of example, if one region of a PCB has many points to be probed and another region is sparsely probed, then it is preferable to apply larger forces against the densely probed region rather than the sparsely probed region.

Another advantage of the present invention over prior art platen arrangements is that the test member under test can be smaller and therefore need not necessarily extend over the entire array of spring probes. Under such conditions, the compliant platen still achieves the application of uniform pressure on the test member. For small boards, inflators not in contact therewith may be isolated from the manifold so as to remain at all times de-actuated.

Preferably, when testing load boards the flexible inflators 20 each has an exterior surface of soft material such as closed-cell neoprene, for absorbing sharp-pointed features and to conform to irregularities sometimes found on PCBs. By way of example, irregularities may be provided by sharp corners on integrated circuit components (ICs) mounted on loaded boards and the ends of electrical conductors extending just above the surface of the board. Such coatings have the quality of inhibiting puncture of the inflators when they come in contact with such sharp pointed features.

An example of a compliant platen 14 having inflators with soft surface material 140 in contact with a loaded board is shown in FIG. 5. The PCB 18 has two ICs 112 and 114 and sharp pointed projections 116 and 118. Although only two ICs and two projections are shown, it is to be understood that many more such irregular surfaces from other elements may characterize a given circuit board.

The flexible inflator 20 indicated at location C and by virtue of its soft surface material conforms to the ICs' sharp corner 112a. Similarly, inflator 20 at location D conforms to the corresponding sharp corner 114a.

Additionally, inflators 20 at locations E and F absorb the sharp pointed projections 116 and 118 respectively. Advantageously, despite such irregular surfaces, the compliant platen in conforming to such irregular surfaces, provides for uniform application of force across the entire PCB 18.

The inflator surface 20a provides about 80 percent board contact for each of the inflators, that is, about 80 percent of the inflator surface area between extremities 20b and 20c respectively makes actual contact with a PCB.

Figure 6A:
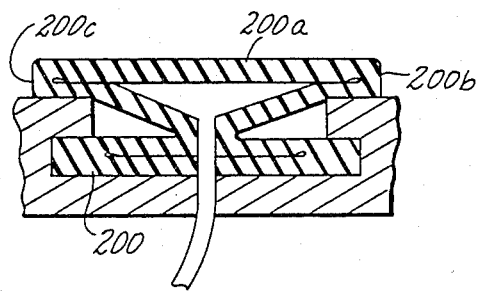
FIG. 6a is a cross-sectional view of an alternate inflator shown mounted in a plate.
Figure 6B:
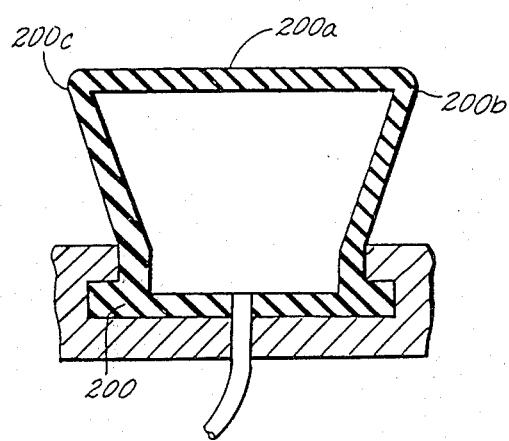
FIG. 6b is a view similar to FIG. 6a showing the inflator of FIG. 6a inflated.

An alternate embodiment of the inflator 20 is shown in FIGS. 6a and 6b. FIG. 6a depicts in cross section a flexible inflator 200 in the relaxed state. The surface region 200a that contacts the PCB 18 forms approximately 100 percent of the surface area lying between extremities 200b and 200c respectively. FIG. 6b depicts the inflator 200 in the actuated or distended state. As is evident from FIG. 6b, approximately 100 percent of the inflator surface area lying between ends 200b and 200c are capable of contacting the PCB 18. It is to be understood that the pressure applied to the inflators may be varied in accordance to the resistive forces provided by the spring probes 62. It is also to be understood that the embodiment of FIGS. 6a and 6b showing the flat distending surface 200a is an example of the inflators of FIG. 1. Normally, the inflator 200 would be one of an array of inflators positioned in side-by-side relation as depicted at 20 in FIG. 2.

An alternate embodiment of a compliant platen is shown in FIG. 7. A plurality of generally square shaped flexible inflators 300 are arranged in a checker board fashion to a rigid platen assembly 302. Although only nine inflators are shown, it is to be understood that many more may be provided in accordance to the size of a circuit board to be tested.

Each of the flexible inflators 300 is coupled to a pressure manifold 304 by means of a connection stem 306. The pressure manifold is coupled to a source of pressurized air depicted at P in FIG. 7. Upon application of pressurized air to the manifold 304, each of the inflator surface areas (shown only on one inflator) indicated at 300a distends upwards (as viewed in FIG. 7) for contacting a PCB. The arrangement of FIG. 7 provides for a more localized application of force than provided by the inflators of FIG. 2.

A further alternate embodiment of a compliant platen is shown in FIG. 8. The foregoing discussion relating to the embodiment of FIG. 7 is equally applicable here except that each flexible inflator 400 has a generally circuit shaped surface area 402 that distends for contacting a PCB.

A still further embodiment of a compliant platen is shown in FIG. 9. A single large flexible inflator 500 is mounted to a rigid platen assembly 502 and is pressurized by means of a source of pressurized air depicted at P through manifold 508 and connection stems 504 and 506. Multiple connection stems are preferable for inflating and deflating of the inflator 500 because of the volume of air required to cause the inflator to distend.

As in the other embodiments, upon application of pressurized air, the inflator 500 distends for contacting a PCB. However, a single large inflator takes longer to inflate relative to a small inflator, it is more difficult to provide uniform pressure across a PCB with which it is in contact and because it is likely that a non-uniform pressure is applied, bowing of the PCB is also likely.

Although an exemplary embodiment of the invention has been disclosed for purposes of illustration, it will be understood that various changes, modifications and substitutions may be incorporated into such embodiment without departing from the spirit of the invention as defined by the claims appearing hereinafter.

What is claimed is:

1. Apparatus for making electrical contact with test points on a test member comprising:
   means for mounting the test member for movement to a test location;
   a plurality of conductive probe heads, each having a contact end, said contact end of each probe head lying generally in a plane that is co-planar with the location for test;
   a plurality of flexible inflators mounted adjacent the test location; and
   means for distending the inflators for causing each inflator to contact such test member for urging such test member to the test location and against the probe heads such that the contact points of the probe heads contact selected test ends on the test member.

2. The apparatus of claim 1 wherein said inflators comprise elongated hollow closed-ended distendable tubes, each tube having means for inletting pressurized fluid to the inflator for causing the inflators to distend.

3. The apparatus of claim 2 wherein said inflators lie in a plane substantially parallel to the test location.

4. The apparatus of claim 3 wherein the inflators are arranged in side-by-side fashion.

5. The apparatus of claim 4 comprising a rigid support engaging the opposite sides of the inflators from the test location such that upon inletting pressurized fluid to the inflators, the inflators distend generally in a direction away from the rigid support and toward the test location.

6. The apparatus of claim 5 wherein said means for mounting a test member comprises means for translation of the test member along a straight line normal to the plane so that upon contact with distending inflators, the test member moves in a direction toward the probe heads.

7. The apparatus of claim 6 comprising means for urging the test member away from the probe heads such that upon relaxation of the inflators, such test member moves in a direction away from the probe heads.

8. The apparatus of claim 7 wherein each of said inflators has a substantially flat portion for contacting the test member such that when the inflators are distended, said flat portions of all of said inflators collectively define a substantially flat continuous surface for contacting such test member.

9. The apparatus of claim 8 wherein each of said inflators has a contacting surface, comprising a soft surface, for conforming to the contour of sharp pointed projections on such a test member, said soft surface for each of said inflators preventing puncture of the inflator.

10. The apparatus of claim 9 wherein the soft surface each of said inflators is formed of closed-cell neoprene.

11. The apparatus of claim 9 wherein the each of said inflators is formed of vulcanized fiber reinforced rubber.

12. The apparatus of claim 6 wherein the distending of the inflators against such a test member at the test location forces such test member against the probe head contact ends so that any non-planar region of the test member deforms under the action of the inflators in contact with such region so that all the probe contact ends are forced into engagement with the test member.

13. The apparatus of claim 7 wherein the apparatus further comprises a conductor coupled to each of said electrical probe heads for making electrical connection therewith.

14. An apparatus for making electrical contact with test points on a test member comprising:
   a plurality of electrically conducting spring probes, each probe having a contact end, all of the contact ends lying essentially in a common plane;
   means for mounting such a test member adjacent the spring probes and for guiding movement of the test member normal to the plane;
   a plurality of rigidly supported flexible and distendable inflators arranged adjacent the test member in side-by-side fashion transverse to said test member such that upon distension the inflators contact the test member and urge it against the contact ends for making electrical connection therewith.

15. An apparatus for making electrical contact with test points on an essentially planar test member comprising:
   a plurality of electrically conductive spring probes, each spring probe having a retractable contact end for contacting a selected test point on the test member;

means for mounting the test member adjacent the spring probes and for guiding movement of the test member toward the spring probes;

a plurality of flexible and distendable inflators arranged adjacent the mounted test member, said inflators each having a face portion for contacting the test member when the inflator is distended for urging the test member against the contact ends such that a non-planar region of the test member deforms under the action of the inflator in contact with such region so that all of the probe contact ends are forced into engagement with the test member.

16. Apparatus for making electrical contact with test points on a test member, the apparatus comprising:

a plurality of electrically conductive probe heads mounted in an array and facing in a substantially common direction for contact with test points on such a test member;

a compliant platen mounted in opposed relation to the probe heads and comprising at least one flexible and distendable inflator facing said probe heads; and means for mounting such a test member between the probe heads and the at least one inflator, fluid pressure applied in the at least one inflator causing the inflator to distend in engagement against such a mounted test member, forcing such a mounted test member against the probe heads, the at least one inflator being adapted for substantially complying with the contour of such a mounted test member to maintain a substantially uniform pressure between such test member and each of said probe heads.

17. Aparatus in accordance with claim 16 comprising a plate for mounting the probe heads.

18. Apparatus in accordance with claim 16 wherein the at least one inflator comprises a plurality of flexible and distendable inflators in opposed relation to the probe heads.

19. Apparatus according to claim 18 wherein each of said plurality of inflators comprises an elongated elastomeric tube and wherein the tubes comprising all inflators are in side-by-side relation.

20. Apparatus according to claim 19 wherein each of the tubes are mounted in a substantially common plane.

21. Apparatus according to claim 18 comprising means for equalizing the pressure between all of the tubes.

22. Apparatus according to claim 21 wherein the means for equalizing the pressure comprises a manifold for coupling each of the inflators to a common source of pressure.

23. Apparatus according to claim 18 comprising a substantially rigid plate positioned against the opposite sides of said inflators from said probe heads and against which said inflators act under pressure.

24. Apparatus according to claim 23 comprising means for affixing each inflator to said plate.

25. Apparatus according to claim 24 wherein the affixing means comprises a dovetail connection between each inflator and the plate.

26. Apparatus according to claim 16 comprising a plate for mounting the probe heads and a plate engaging the opposite side of the at least one inflator from said probe heads and means for mounting the plates in fixed relation to each other.

27. Apparatus according to claim 16 wherein the probe heads are mounted in an interchangeable test head which interchangeable test head is removably mounted in said apparatus.

28. Apparatus according to claim 16 comprising a plurality of spring probes, each of said probe heads comprising one of said spring biased probe heads.

29. Apparatus according to claim 28 comprising a plate for mounting said spring probes.

30. Apparatus according to claim 16 wherein said at least one inflator has a front surface for engaging the test member and which distends under pressure, said inflator being elastomeric and being adapted, after the pressure is removed, for retracting the front surface thereof, due to the resiliency thereof, from the distended position to a retracted position.

31. Apparatus according to claim 18 wherein each of said inflators has a front surface for engaging such a test member and distends under pressure, each of said inflators being elastomeric and being adapted, after the pressure is removed, for retracting the front surface thereof, due to the resiliency thereof, from the distended position to a retracted position.

32. Apparatus according to claim 18 wherein the portion of each inflator which contacts such a test member comprises a substantially soft surface.

33. Apparatus according to claim 18 wherein the array of probe heads spans a plane covering a plurality of said inflators.

34. Apparatus according to claim 18 wherein said inflators comprise a substantially flat front surface and wherein each of said inflators distends the front surface thereof under pressure.

35. Apparatus for making electrical contact with test points on a substantially planar test member comprising:

a plurality of electrical contacts mounted in the apparatus in a spaced apart array facing in the direction of a plane for receipt of such a test member; and a plurality of flexible and distendable inflators, each inflator having a separate fluid inlet, first and second ends and an elongated portion between said ends, the inflators each having, facing said contacts, the elongated portion thereof in substantially parallel side by side relation to the elongated portion of the other inflators;

the inflators when distended forcing such a test member, when positioned between the inflators and the array of contacts, against and in electrical contact with the contacts in said array.

36. Apparatus according to claim 35 wherein each of said contacts comprises an electrical contact head mounted for moving toward and away from and biased in the direction of such plane for a test member.

37. Apparatus according to claim 36 wherein said contacts comprise spring probes.

38. Apparatus according to claim 35 wherein each of said inflators comprises an elongated hollow closed-ended distendable tube.

39. Apparatus according to claim 38 wherein each of said tubes comprises means for inletting pressurized fluid to the tube.

40. Apparatus according to claim 35 wherein each of said inflators comprises a front portion which lies in a substantially common plane.

41. Apparatus according to claim 38 wherein each of said tubes, when deflated, comprises a substantially flat front surface.

42. Apparatus according to claim 41 wherein the substantially flat front surface of each of said tubes, when the tubes are deflated, lie in a substantially common plane.

43. Apparatus according to claim 38 wherein each of said elongated tubes is elongated along a substantially straight line and positioned such that a front surface of each tube, which faces in the direction of such plane for the test member, lies in a common plane when the tubes are inflated.

44. Apparatus according to claim 35 comprising a rigid support member for mounting said array of contacts.

45. Apparatus according to claim 44 wherein said support member comprises a plate and each of the contacts has first and second opposite ends positioned on opposite sides of the plate.

46. Apparatus according to claim 35 comprising a rigid support member for mounting said inflators.

47. Apparatus according to claim 46 wherein said support member comprises at least one plate, the inflators being mounted at a position between the at least one plate and the contacts.

48. Apparatus according to claim 35 comprising a common support means for mounting the array of contacts and the inflators and for preventing movement of the contacts and inflators away from each other due to forces therebetween.

49. Apparatus according to claim 35 comprising means for mounting such a test member for movement toward the array of contacts under the urging of each of said inflators when distended.

50. Apparatus according to claim 49 comprising biasing means for urging said mounting means, and a test member mounted therein, in a direction away from the contacts upon termination of the distension of the inflators.

51. Apparatus for making electrical contact with test points on a substantially planar test member comprising:
a plurality of electrical contacts mounted in the apparatus in a spaced apart array facing in the direction of a plane for receipt of such a test member; and
a plurality of flexible and distendable inflators mounted side by side in the apparatus facing in the opposed relation to said array of contacts and toward such plane for the receipt of a test member;
the inflators when distended forcing such a test member, when positioned between the inflators and the array of contacts, against and in electrical contact with the contacts in said array;
each inflator having a soft surface facing in the direction of the plane for a test member for conforming to the contour of projections on a test member.

52. Apparatus according to claim 51 wherein the soft surface comprises closed cell neoprene.

53. Apparatus according to claim 52 wherein the inflator comprises vulcanized fiber reinforced rubber.

54. Apparatus according to any of claims 35, 49 or 51 wherein the inflators are free to extend into direct contact with the planar test member as the inflators are distended.

55. Apparatus according to claim 35 comprising:
a substantially rigid backup means for said inflators; and
said inflators being positioned between said contacts and said backup means and against said backup means.

56. Apparatus according to claim 35 wherein said inflators each have a fluid chamber therein which is closed at opposite ends.

57. Apparatus according to claim 35 wherein said backup means comprises a groove for each inflator and each said inflator comprises a dovetail-shaped portion extending into the corresponding one of said grooves for affixing each said inflator to said backup means.

58. Apparatus according to claim 55 comprising:
substantially common mounting means for mounting the contacts;
common backup means for said inflators;
means for obstructing movement apart of the mounting means and backup means during the forcing of the test member against the contacts by the inflators due to distension of the inflators.

59. Apparatus according to claim 58 wherein each contact comprises a spring probe having a probe head resiliently biased in the direction of the inflators.

60. Apparatus according to claim 59 wherein the contact mounting means comprises a plate and the spring probes are mounted therein.

61. Apparatus according to claim 35 wherein each of said inflators comprises a front portion which, when the inflator is not distended, lies in a substantially common plane.

62. Apparatus for making electrical contact with test points on a test member comprising:
means for mounting the test member at a location for a test member;
a plurality of conductive probe heads, each having a contact end, said contact end of each probe head lying generally in a plane facing such a location for a test member;
a plurality of flexible inflators mounted on the opposite side from such location for a test member and in opposed relation to said contact ends; and
means for distending the inflators for causing each inflator to urge such a mounted test member, while contact is made between the inflators and such a mounted test member, against the contact ends of the probe heads, the contact ends thereby making electrical contact with selected test points on such a mounted test member.

* * * * *

UNITED STATES PATENT AND TRADEMARK OFFICE
CERTIFICATE OF CORRECTION

Page 1 of 2

PATENT NO. : 4,427,250

DATED : Jan. 24, 1984

INVENTOR(S) : Hines, Fettig

It is certified that error appears in the above-identified patent and that said Letters Patent is hereby corrected as shown below:

Column 1, line 35, "value" should be -- values --;
col. 1, line 58 "head to circuit" should be -- head-to-circuit- --;
col. 2, line 32, "aplied" should be -- applied --;
col. 3, line 2, after "as" insert -- are --;
col. 4, line 38, after "side" insert -- elevational --;
col. 4, line 43, delete "elevation"; line 44 "plate" should be -- platen --; line 66 "plate" should be -- platen --;
col. 5, line 19 "tenor" should be -- tenon --;
col. 5, line 41 after "30" insert -- is --; line 42 after "and" insert -- is --; line 56 change "slide-" to -- slid --;
col. 6, line 16, "beam 5" should be -- beam 58 --;
line 40 "contacts" should be -- contact --; line 51 "of a the" should be -- of the --; lines 63-64, delete "and Actuable Interface Assembly Therefore";
col. 7, line 22, change "slideable" to -- slidable --;
line 38 change "slideable" to -- slidable --; line 38 "crore" should be -- corre --; line 50 before "mounting" insert -- the --;
col. 8, line 39 "occurring" should be -- occur --;

UNITED STATES PATENT AND TRADEMARK OFFICE
CERTIFICATE OF CORRECTION

Page 2 of 2

PATENT NO. : 4,427,250

DATED : Jan. 24, 1984

INVENTOR(S) : Hines, Fettig

It is certified that error appears in the above-identified patent and that said Letters Patent is hereby corrected as shown below:

col. 9, line 27 "distend and urge" should be -- distends and urges --; line 30 delete "shown"; line 52 after "compensated" insert -- for --;
col. 10 line 8 "sparcely" should be -- sparsely --; line 18 "load" should be -- loaded --; line 36 delete "from other elements"; line 38 "andby" should be -- by --; line 62 "are" should be -- is --;
col. 11, line 24 "circuit" should be -- circular --; line 37 "However," should be -- Because --;
Claim 1, col. 11, line 63, "ends" should be -- points --;
col. 12, claim 10, after "surface" insert -- of --;
line 44 delete "such region" and insert therefor -- the test member --.

Signed and Sealed this

Sixth Day of November 1984

[SEAL]

Attest:

Attesting Officer

GERALD J. MOSSINGHOFF

Commissioner of Patents and Trademarks